United States Patent [19]

Peterson

[11] 4,021,786
[45] May 3, 1977

[54] MEMORY CELL CIRCUIT AND SEMICONDUCTOR STRUCTURE THEREFORE

[75] Inventor: Harry W. Peterson, Mountain View, Calif.

[73] Assignee: Fairchild Camera and Instrument Corporation, Mountain View, Calif.

[22] Filed: Oct. 30, 1975

[21] Appl. No.: 627,445

[52] U.S. Cl. .......................... 340/173 FF; 307/238; 307/279; 357/54

[51] Int. Cl.² .................. G11C 11/40; H03K 5/00; H03K 3/26; H01L 29/34

[58] Field of Search ................. 340/173 FF, 173 R; 307/238, 279, 291; 357/54

[56] References Cited

UNITED STATES PATENTS

| | | | |
|---|---|---|---|
| 3,540,010 | 11/1970 | Heightley et al. | 340/173 FF |
| 3,548,386 | 12/1970 | Bidwell et al. | 340/173 FF |
| 3,772,660 | 11/1973 | Norman | 340/173 R |
| 3,781,828 | 12/1973 | Platt et al. | 340/173 R |
| 3,909,807 | 9/1975 | Fulton | 340/173 FF |

Primary Examiner—Daryl W. Cook
Attorney, Agent, or Firm—Alan H. MacPherson; Henry K. Woodward; Norman E. Reitz

[57] ABSTRACT

A new and improved memory cell is provided which comprises a word line, a pair of bit lines, a pair of current sources each having a first side coupled to a corresponding one of the bit lines; and a bistable circuit means operatively coupled to the word line and to another side of each of the current sources, whereby the bistable circuit means assumes one stable state upon the application of a voltage on one bit line, and assumes another stable state upon the application of a voltage on the other bit line.

In addition, several embodiments of semiconductor structures are provided for the new and improved memory cell.

18 Claims, 8 Drawing Figures

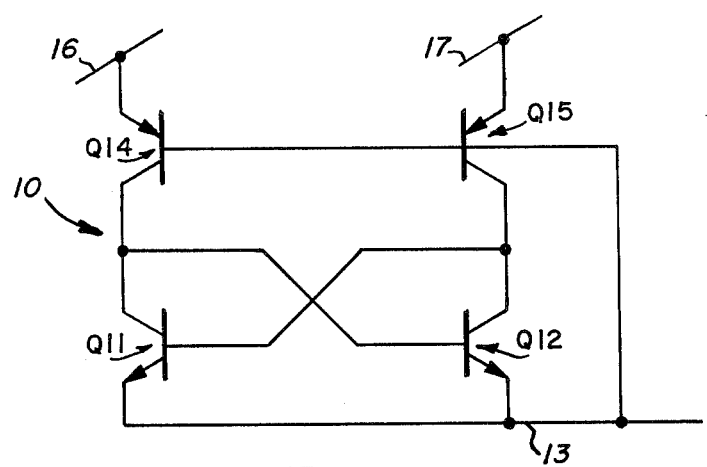
Fig_1
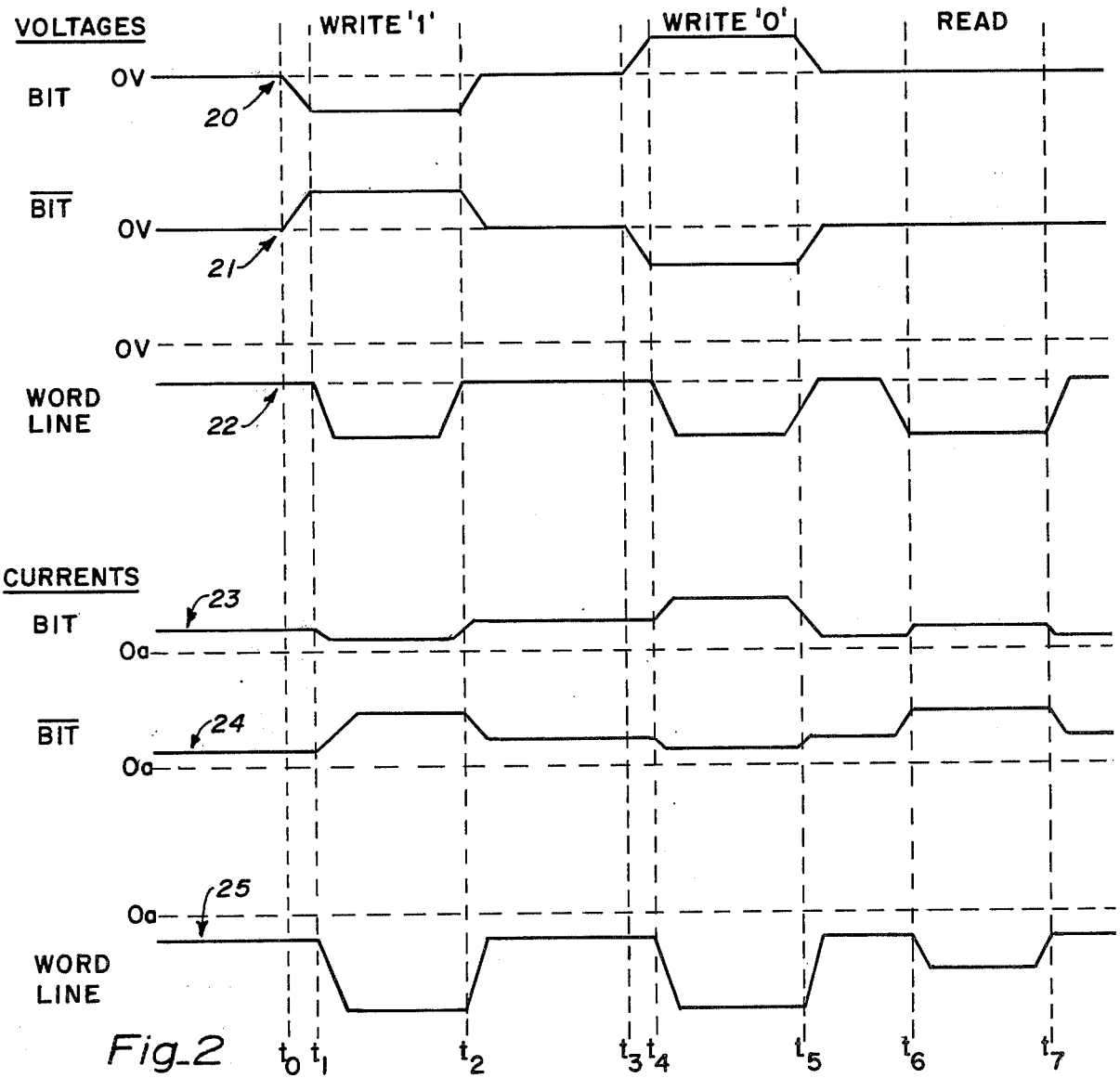
Fig_2

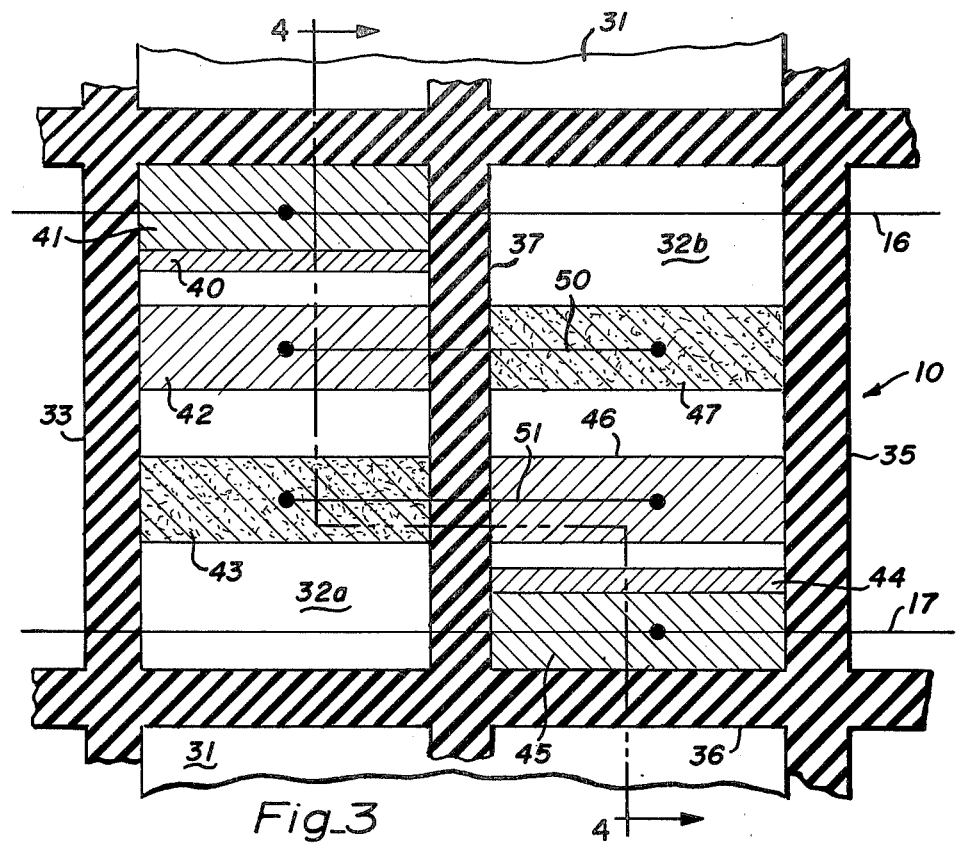
Fig_3
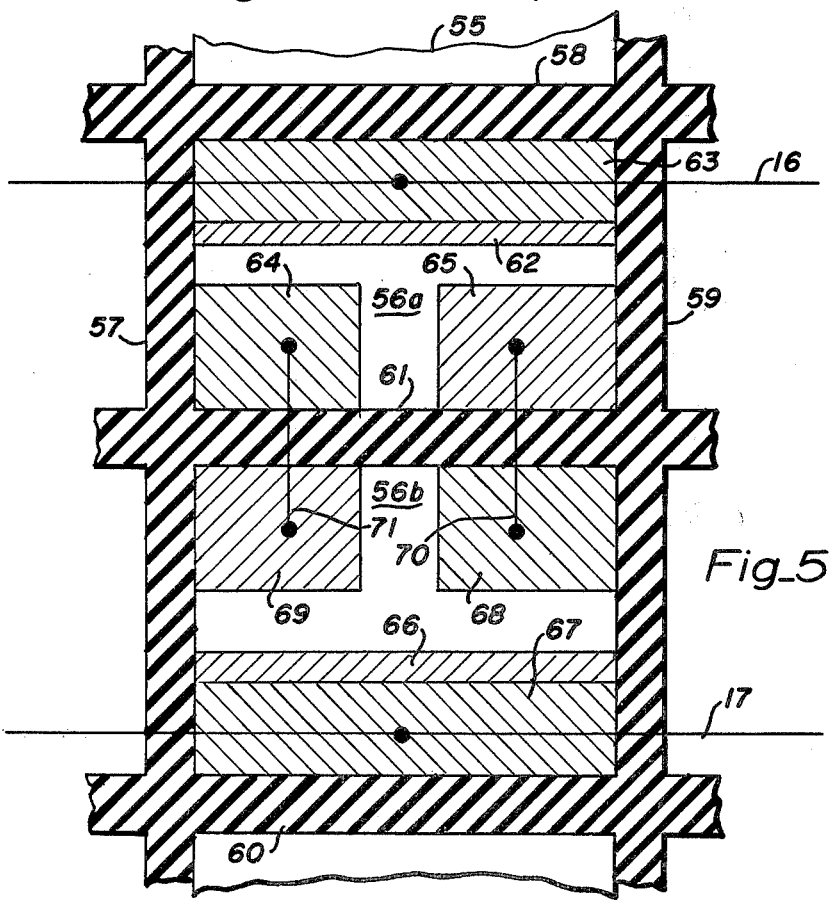
Fig_5

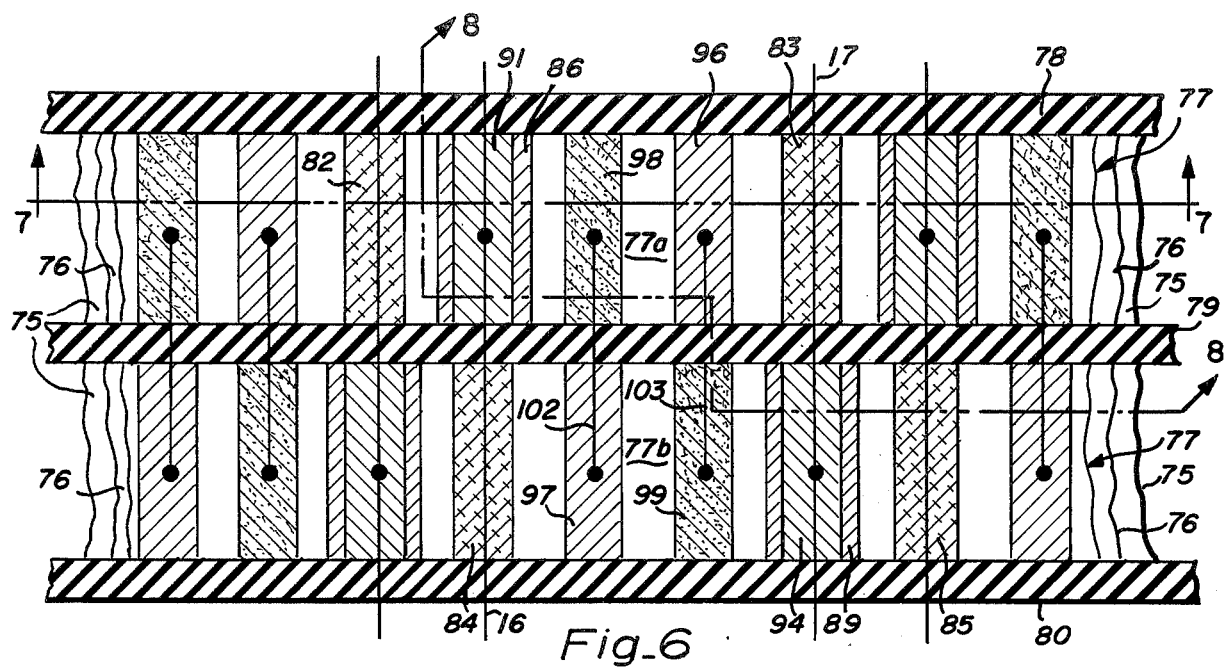
Fig_6
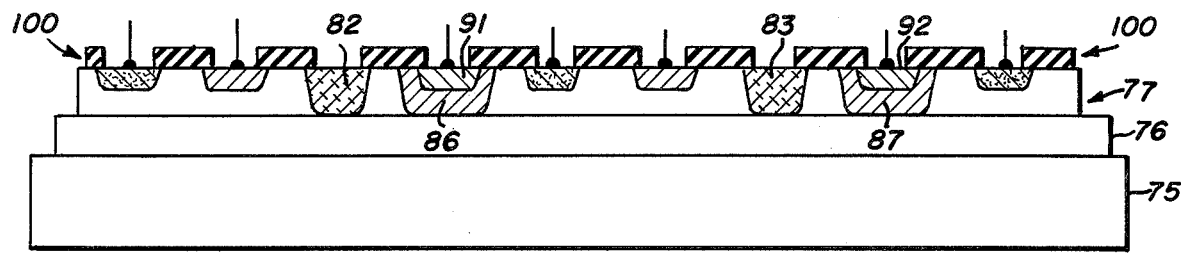
Fig_7
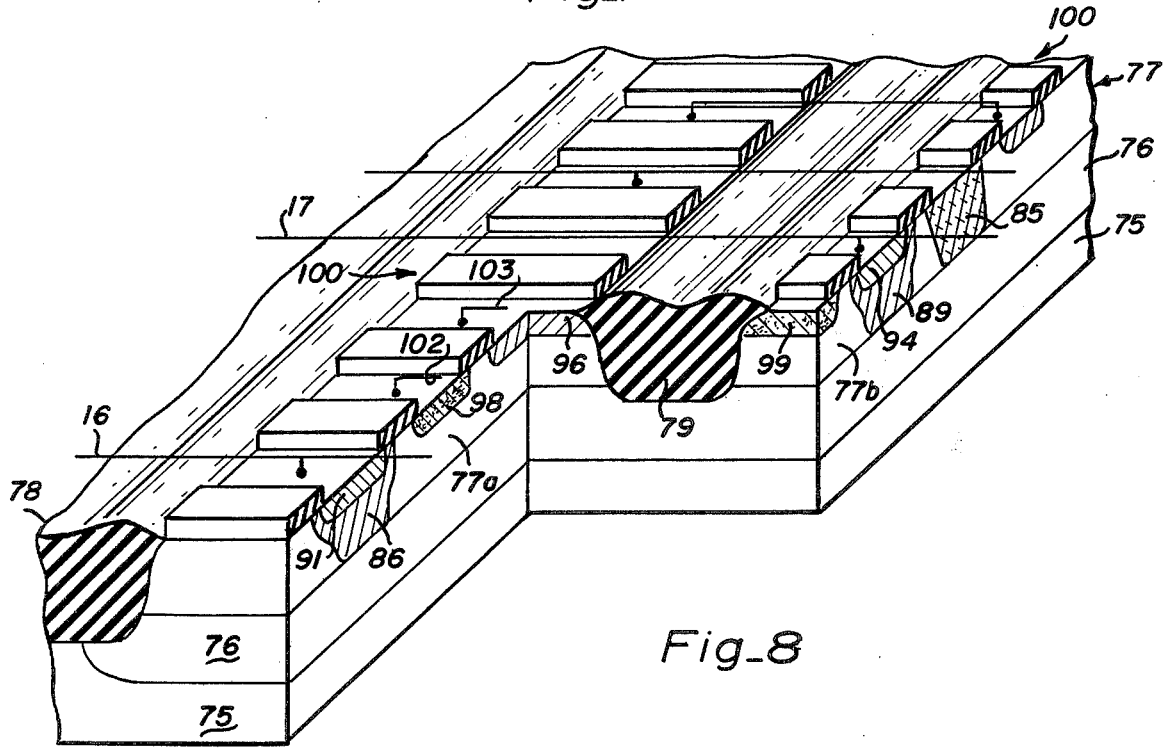
Fig_8

MEMORY CELL CIRCUIT AND SEMICONDUCTOR STRUCTURE THEREFORE

BACKGROUND OF THE INVENTION

1. Field of the Invention

This invention relates to memory storage devices or memory cells for use in Random Access Memories (RAM's), and more particularly to a memory cell of the so-called injection logic type integrated circuit including a bistable circuit having a pair of switching transistors.

2. Prior Art

The present invention is an improvement over the prior art monolithic memory cell as disclosed in U.S. Pat. No. 3,815,106 issued June 4, 1974, to Sigfried Kurt Wiedmann.

Prior art memory cells usually require that each cell in the memory array have two power connections, which connections may be shared with adjacent cells. If, for example, the power connections also are used for row addressing, such connections can only be shared with other cells of the same row. This requirement of additional power connections to the memory cells increases the complexity of a memory array including a multiplicity of such memory cells. Such a prior art device is disclosed in U.S. Pat. No. 3,886,531, issued May 27, 1975, to Jon L. McNeill. The prior art memory cells will be described in greater detail under the Detailed Description hereinbelow.

SUMMARY OF THE INVENTION

A new and improved memory cell is provided which comprises a word line, a pair of bit lines, a pair of current sources each having a first side coupled to a corresponding one of the bit lines; and a bistable circuit means operatively coupled to the word line and to another side of each of the current sources, whereby the bistable circuit means assumes one stable state upon the application of a voltage on one bit line, and assumes another stable state upon the application of a voltage on the other bit line.

In addition, a semiconductor memory cell structure is provided which comprises a semiconductor substrate of a first conductivity type, a buried layer formed in the substrate from semiconductor material of a second conductivity type to form a word line of the semiconductor memory cell, an epitaxial layer formed over the buried layer from a semiconductor material of the first conductivity type, the epitaxial layer being partitioned into two halves by an isolation barrier. Further, each half of the epitaxial layer comprises a first region of semiconductor material of the second conductivity type, a second region of semiconductor material of the first conductivity type, a third region of semiconductor material of the second conductivity type and a fourth region of semiconductor material of the first conductivity type. First electrical conducting means is provided for forming a first bit line and coupled to the second region in a first half of the epitaxial layer, second electrical conducting means forming a second bit line and coupled to the second region and the second half of the epitaxial layer, third electrical conducting means coupling the third region in the first half of the epitaxial layer with the fourth region in the second half of the epitaxial layer, and fourth electrical conducting means coupling the fourth region in the first half of the epitaxial layer with the third region in the second half of the epitaxial layer.

BRIEF DESCRIPTION OF THE DRAWINGS

FIG. 1 is a schematic diagram of a memory cell in accordance with the present invention;

FIG. 2 is a timing diagram showing voltages and currents for typical operations of the present invention;

FIG. 3 is a planar view of an integrated structure of the present invention;

FIG. 5 is a planar view of another embodiment of an integrated structure of the present invention;

FIG. 6 is a planar view of still another embodiment of an integrated structure of the present invention;

FIG. 7 is a cross-sectional view of a part of the integrated structure shown in FIG. 6; and FIG. 8 is an isometric cross-sectional view of the integrated structure shown in FIG. 6.

DETAILED DESCRIPTION

Figure 4:
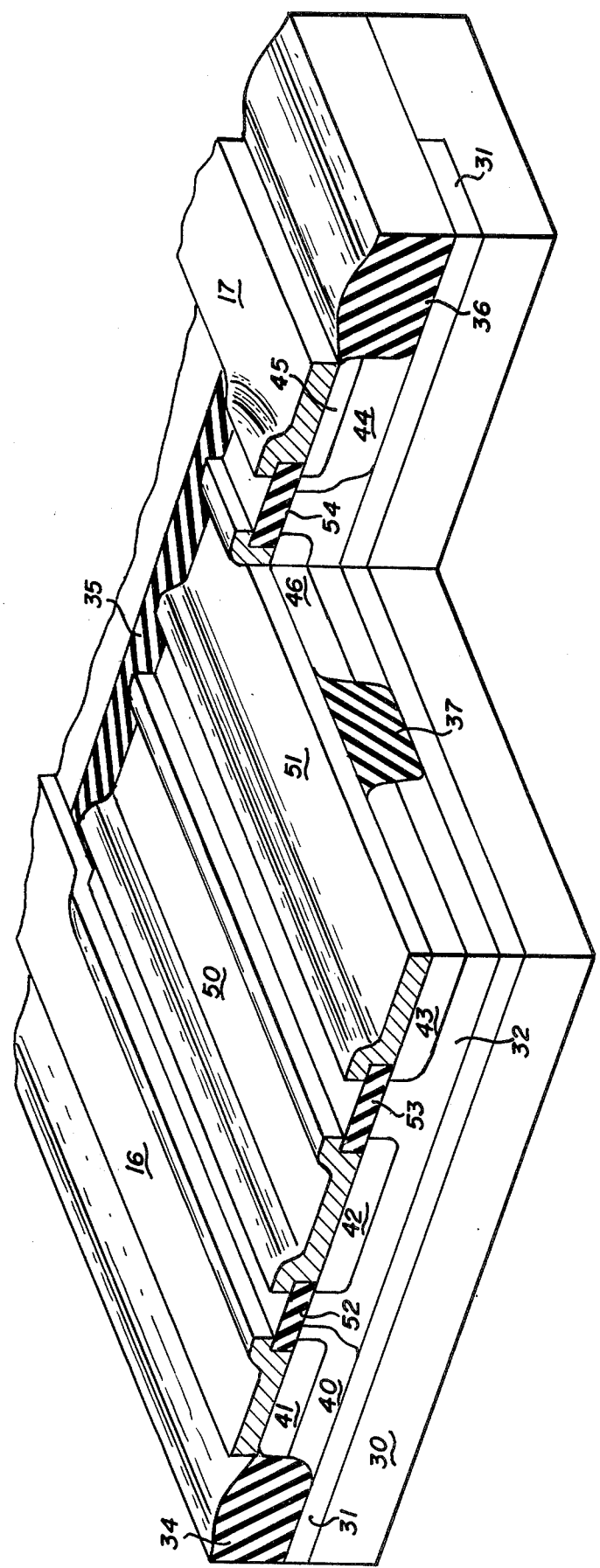
FIG. 4 is an isometric cross-sectional view of the integrated structure shown in FIG. 3.

Referring now to the drawings, and in particular to FIG. 1, a schematic diagram of memory cell 10 in accordance with the present invention is illustrated. A pair of switching transistors Q11 and Q12 are cross-coupled to form the basic bistable circuit of the memory cell 10. That is, the base terminal of the transistor Q11 is coupled to the collector terminal of Q12, and the base terminal of the transistor Q12 is coupled to the collector terminal of Q11. The emitter terminals of the transistors Q11 and Q12 are coupled to a word line 13. The collector terminal of the transistor Q11 is also coupled to the collector terminal of a current source transistor Q14, and in a similar manner the collector terminal of the transistor Q12 is coupled to the collector terminal of a second current source transistor Q15. The base terminals of the transistors Q14 and Q15 are coupled to a word line 13. The emitter terminal of the transistor Q14 is coupled to a first bit line 16 and the emitter terminal of the transistor Q14 is coupled to a second bit line 17.

Transistors Q11 and Q12 form a standard crosscoupled flip-flop or bistable circuit. That is, in operation, if transistor Q11 is ON, it absorbs a collector current from transistor Q14, and pulls transistor Q12 into an OFF state. This condition, however, is accomplished in one embodiment so long as the voltages supplied on the bit lines 16 and 17 are approximately equal. Transistors Q14 and Q15 act as current sources or impedance loads for the transistors Q11 and Q12, respectively. In other words, transistors Q14 and Q15 operate as injectors for transistors Q11 and Q12 respectively, where the present invention is implemented with the so-called injection logic technique.

Referring now to FIG. 2, a timing diagram of the operation of memory cell 10 is illustrated. Waveform 20 represents the voltage appearing on the bit line 16 during both a write and read operation. Waveform 21 represents the voltage appearing on the bit line 17 during the same write and read operation. Waveform 22 represents the voltage appearing on the word line 13 during the same read and write operation. It is noted that the magnitude of waveform 22 between times $t_6$ and $t_7$ may be higher or lower than that required for a write operation. Waveform 23 represents the current on the bit line 16 during a write and read operation; and waveform 24 represents the current appearing on the bit line 17 during the same write and read operation. In a similar manner, waveform 25 represents the current appearing on the word line 13 during the same write and read operation. It is noted that the shape of the waveforms 20 through 25 are exaggerated in magnitude in the drawing for clarification purposes.

A binary 1 is written into the cell 10 by raising the voltage on the bit line 17 relative to the voltage on the bit line 16. At the same time, the voltage on the word line 13 is decreased, as for example by coupling the word line 13 to a current sink (not shown). With reference to waveforms 20 through 22, between times $t_0$ and $t_2$, a "write one" operation is illustrated. In response to the voltage changes on the bit lines 16 and 17, and on the word line 13, the currents on the same lines likewise change as indicated by waveforms 23 through 25 between times $t_o$ and $t_2$. Note that between times $t_1$ and $t_2$ more current flows through bit line 17 (waveform 24) than through bit line 16, (waveform 23). Thus, the memory cell 10 is placed into a binary 1 state, wherein transistor Q11 is ON and transistor Q12 is OFF.

To write a binary 0 into memory cell 10, the voltage applied on the bit lines 16 and 17 are reversed from that used to write a binary 1. With reference to waveforms 20 through 22 between times $t_3$ and $t_5$ it may be seen that the voltage is raised on the bit line 16 and lowered on the bit line 17 with a simultaneous decrease in the voltage on the word line 13. In response to the above voltage changes the current supplied on the bit line 16 increases while the current on the bit line 17 decreases. Thus, a binary 0 is written into the cell 10. Alternatively, as stated hereinabove, it is possible to sink the current on word line 13 to accomplish the same result of addressing the memory cell. Accordingly, data are written into the memory cell 10 by changing the voltages on bit line 16 and 17 with a simultaneous voltage or current change on the word line 13.

During a read operation, the information stored in the memory cell 10 may be read out by sensing the difference in currents on the bit line 16 and 17, which are held at the same voltage. Assume, for example, that transistor Q12 is ON and transistor Q11 is OFF. Further, assume that this state of the memory cell 10 is indicitive of a binary 0. With transistor Q12 ON, the collector voltage thereof is substantially the same as the voltage on the word line 13. If the voltage on the word line 13 drops to a low-level, the voltage at the collector of the transistor Q12 is also low, which low voltage is coupled to the base of transistor Q11; thereby holding Q11 in an OFF state. At the same time, transistor Q14 and Q15 are ON. By saturating transistor Q14, the voltage appearing on the bit line 16 is coupled through to the collector of Q14, and also to the base terminal of the transistor Q12. In response to the above voltage and current changes (waveforms 20 through 22 between times $t_6$ and $t_7$) a nominal current increase appears on the bit line 16 whereas a substantial current increase appears on the bit line 17 (waveform 24 between times $t_6$ and $t_7$).

In general, the detection of the state of the memory cell 10 is accomplished by sensing the difference between the current and voltage characteristics of the emitter-base junctions of a saturated versus an unsaturated transistor. In the example whereas transistor Q12 is ON and Q11 is OFF, the collector-base terminal of transistor Q14 is substantially forward biased, and the collector base of Q15 is only slightly forward baised.

Accordingly, transistor Q14 is by definition saturated and transistor Q15 is unsaturated. Therefore, the voltage drop across the collector-emitter terminals of transistor Q14 is low and there will be negligible current flow through Q14. A large amount of current will flow through the transistor Q15 as a result of a low voltage on the collector thereof with respect to the voltage on the bit line 17. Thus, a large current will be supplied on the bit line 17 vis-a-vis bit line 16, thereby indicating that the date of the memory cell 10 is a binary 1. Thus, to read the contents of memory cell 10, the base-emitter voltage ($V_{BE}$) of transistors Q14 and Q15 is substantially the same, and the current on each bit line is compared. Accordingly, in the example discussed above, bit line 16 will sink less current than bit line 17.

An inherent characteristic of the transistors Q14 and Q15 employed in fabricating one embodiment of the memory cell 10 is that when the current flowing through the transistor is at a low level the inverse beta thereof is at a low value. However, if a large amount of current is passed through these transistors, the inverse beta is at a higher value. That is, the inverse beta is a function of the current flowing through the transistor. The result accomplished is that unaddressed memory cells in an array of such memory cells will not contribute any appreciable current on the bit lines. It is noted, however, that transistors with constant forward and inverse betas will also operate satisfactorily in the memory cell 10 for transistors Q14 and Q15.

Referring now to both FIGS. 3 and 4, an integrated structure of one embodiment of the memory cell 10 is illustrated. The starting material for constructing the memory cell 10 of the present invention is a p-type semiconductor substrate having a resistance of 10 to 20 Ohms per centimeter. It is pointed out, however, that opposite types of semiconductor materials can be used in fabricating the present invention. Thus, the types of semiconductor material illustrated and described herein are exemplary only.

Next, a buried layer 31 of n-type semiconductor material is formed in the substrate 30 in the area upon which the memory cell 10 is to be formed. An epitaxial layer 32 is formed over the buried layer 31 and comprises a p-type semiconductor material. As may be seen in FIG. 3, insulation strips 33 to 36 form four sides of the memory cell 10, and insulation strip 37 divides the memory cell into two areas 32a and 32b, respectively. Insulation strips 33 through 37 are typically formed by removing part of the epitaxial layer 32 where such strips are desired, and oxidizing the remaining semiconductor material as disclosed in U.S. Pat. No. 3,648,125 entitled "Method of Fabricating Integrated Circuits with Oxidized Isolation and the Resulting Structure", which issued Mar. 27, 1972 to Peltzer.

Cross-sections of insulation strips 34, 36 and 37 are shown in FIG. 4; and, a portion of the top side of insulation strip 35 is also illustrated in FIG. 4.

Once insulation strips 33 to 37 divide the p-type epitaxial layer 32 into areas 32a and 32b, as shown in FIG. 3, a region 40 of n-type semiconductor material is diffused into area 32a of epitaxial layer 32. Next, a region of p-type semiconductor material 41 is diffused into region 40. Regions 40 and 41, and epitaxial layer area 32a form the PNP injector transistor Q14. Region 40 makes ohmic contact with the buried layer 31. Bit line 16 is coupled directly to the region 41, which comprises the emitter of transistor Q14. A region 42 of $n^+$-type semiconductor material is next diffused into the epitaxial layer area 32a near regions 40 and 41. Ohmic contact is made to epitaxial layer area 32a in a region 43. For example, a $p^+$-type semiconductor material may be diffused into region 43 at the same time as region 41 to form the ohmic contact, which is the base contact to transistor Q12. Region 42 forms the collector of NPN transistor Q12 and the epitaxial layer area 32a forms the base of this transistor. The buried layer 31 forms the emitter of the transistor Q12.

A second injector forming PNP transistor Q15 is formed by first diffusing a region 44 of n-type semiconductor material into the epitaxial layer area 32b of cell 10. Region 44 makes ohmic contact with the buried layer 31. Next, a region 45 of p-type semiconductor material is diffused into region 44 to form the emitter of the transistor Q15. Regions 40 and 41, and regions 44 and 45 are double diffused lateral transistors as disclosed in U.S. Pat. No. 3,873,989 entitled the same, which issued Mar. 25, 1975 to Schinella and Anthony.

Bit line 17 is coupled directly to region 45. A region 46 of n-type semiconductor material is diffused into the epitaxial layer area 32b adjacent to regions 44 and 45. Next, ohmic contact is made to epitaxial layer area 32b by forming a region 47 of $p^+$-type semiconductor material in the epitaxial layer. Region 45 forms the emitter of the transistor Q15, region 44 forms the base of this transistor, and region 47 forms the collector thereof and the base of the transistor Q11. Region 42 is coupled to region 47 by means of conductor 50, which couples the collector of transistor Q14 to the collector of transistor Q11. Likewise, connector 51 couples region 43 to region 46 thereby coupling the collector of transistor Q15 to the collector of transistor Q12.

As may be seen in FIG. 4, insulation layers 52, 53 and 54 are disposed on the top side of the structure between regions 41 and 42, 42 and 43, as well as between regions 46 and 47, and 46 and 45, respectively. These insulation layers are employed for masking the diffusion of the above-described regions, and are not shown in FIG. 3 for simplification of the drawings.

Referring now to FIG. 5, a planar top-side view of another embodiment of the present invention is illustrated. The structure illustrated in FIG. 5 is fabricated upon a p-type substrate as described hereinabove with an overlying buried layer 55 of n-type semiconductor material. An epitaxial layer 56 is formed over the buried layer 55. Insulation strips 57 to 60 are formed in the epitaxial layer 56 to form the boundaries of the memory cell. Another insulation strip 61 divides the memory cell into two equal areas 56a and 56b. Next, an n-type semiconductor material is diffused into a region 62 of the epitaxial layer area 56a. A p-type semiconductor material is diffused into a region 63 within the region 62. Regions 62 and 63 together with epitaxial layer area 56a form injector transistor Q14, wherein region 63 forms the emitter of this transistor. A region 64 of $p^+$-type semiconductor material is diffused into the epitaxial layer area 56a to form a base contact for the transistor Q12. An n-type semiconductor material is diffused into a region 65 to form the collector region for the transistor Q12, and the underlying buried layer 55 forms the emitter of Q12.

In the area 56b of the epitaxial layer 56, an n-type semiconductor material is diffused into a region 66. Next, a p-type semiconductor material is formed in a region 67 located within the region 66. Region 67 forms the emitter for the transistor Q15, and region 66 forms the base region thereof. The collector of Q15 comprises area 56b of the epitaxial layer. In a similar manner, a $p^+$-type semiconductor material is diffused into a region 68 to thereby form the base contact for the transistor Q11. An n-type semiconductor material is diffused into a region 69 to form the collector contact for the transistor Q12. Bit line 16 makes ohmic contact to the region 63, and bit line 17 makes ohmic contact to the region 67. A connector 70 forms the electrical connection between the regions 65 and 68, which couples the collector of the transistor Q12 to the base of transistor Q11 and the collector of the transistor Q15. In a similar manner, a connector 71 couples the region 69 with the region 64 to thereby couple the collector of the transistor Q14 to the base of transistor Q12 and the collector of the transistor Q11.

Referring now to FIG. 6, a portion of an array of N×M memory cells constructed in accordance with another embodiment of this invention is illustrated. N is a positive integer representing the number of cells in a row of the array, and M is a positive integer representing the number of cells in a column of the array. FIGS. 7 and 8 illustrate cross sections of the partial array illustrated in FIG. 6. As in the previously described embodiments, the starting material for formation of the memory cell is a substrate 75 of p-type semiconductor material. As noted hereinabove, however, opposite types of semiconductor material may be employed for various components, and the materials described herein are by way of example only.

A buried layer 76 of n-type semiconductor material is formed in the substrate 75, and an epitaxial layer 77 of p-type semiconductor material is formed over the buried layer 76. Next strips 78, 79, 80 . . . . of insulation material, such as for example silicon dioxide, are formed in the epitaxial layer 77 down to and partially penetrating the buried layer 76. The insulation strips 78, 79, 80 . . . . partition the epitaxial layer 77 into isolated active strips 77a, 77b, . . . , which are employed for forming memory cells of the present invention.

Each strip 77a, 77b, . . . , of the epitaxial layer 77 is further partitioned into isolated active areas by diffusing at periodic intervals an n-type semiconductor material into regions 82, 83, 84, 85, . . . down to a depth coincident with the top of buried layer 76. Regions 82 through 85 form PN isolation junctions which isolate one memory cell from adjacent memory cells in the same row of cells in the array. One half of a memory cell in accordance with the present invention is fabricated between regions 82 and 83 in the active strip 77a of the epitaxial layer 77, and the second half is fabricated between regions 84 and 85 in the active strip 77b.

In particular, an n-type semiconductor material is formed in the active strip 77a adjacent to region 82 to form a region 86. At the same time, region 89 is formed in the epitaxial layer 77 by diffusion of the n-type semiconductor material in an area adjacent to region 85. The semiconductor material employed in forming regions 86 and 89 may be the same as that used to form regions 82 through 85. Alternatively, however, an $n^-$-type semiconductor material may be used to form regions 82 through 85 when an n-type semiconductor material is used to form regions 86 and 89. Note in FIG. 6 that region 86 is formed to the right of region 82 and region 89 is formed to the left of region 85. The terms "left" and "right" are used herein in the usual manner when viewing the drawings conventionally.

Next, a p-type semiconductor material is formed in regions 91 and 94, which regions are located within regions 86 and 89, respectively. An n+-type semiconductor material is formed in regions 96 and 97 near the regions 83 and 84, respectively. P+-type semiconductor material is formed in regions 98 and 99 near regions 86 and 89, respectively.

A single memory cell in accordance with the present invention comprises regions 91, 86, 96 and 98 between the n regions 82 and 83, and regions 89, 94, 97 and 99 between the n regions 84 and 85. The remaining regions illustrated in the drawings form parts of other cells in the array, and will not be discussed further herein. It is also noted that insulation layer 100 is illustrated in FIGS. 7 and 8 over topside portions of the above-described structure, and is omitted in FIG. 6 for clarification of the drawings. Layer 100 may, for example, comprise silicon dioxide. In addition, the topside metal interconnection layer is represented schematically in the drawings for simplification and clarity.

Bit line 16 is formed in ohmic contact with region 91, which region forms the emitter of PNP transistor Q14 (FIG. 1). Region 86 forms the base of transistor Q14, and portion 77a of the epitaxial layer 77 forms the collector thereof. Note in FIG. 7 that region 86 makes ohmic contact with buried layer 76, which forms the word line 13 of the memory cell 10 (FIG. 1). Region 98 forms the base contact of the transistor Q12, and region 97 forms the collector of the transistor Q11. A metal connector 102 couples region 98 (base of Q12) to region 97 (collector of Q11). In a similar manner, a metal connector 103 couples region 99 (base of Q11) to region 96 (collector of Q12). Bit line 17 is formed in ohmic contact with region 94, which region forms the emitter of PNP transistor Q15. Region 89 forms the base of transistor Q15, and portion 77b of the epitaxial layer 77 forms the collector thereof.

While the invention has been particularly shown and described with reference to several preferred embodiments thereof, it will be understood by those skilled in the art that the foregoing and other changes in form and details may be made therein without departing from the spirit and scope of the invention.

I claim:
1. A memory cell comprising:
 a. a word line;
 b. a pair of bit lines;
 c. a pair of current sources comprising a pair of transistors each having an emitter coupled to a corresponding one of said pair of bit lines, a base coupled to said word line, and a collector terminal;
 d. bistable circuit means comprising a pair of switching transistors each having a collector terminal coupled to a corresponding collector terminal of one of said current source transistors, a base terminal coupled to the collector terminal of the other of said pair of current source transistors, and an emitter terminal coupled to said word line, whereby said bistable circuit means assumes one stable state upon the application of a voltage on one bit line, and assumes another stable state upon the application of a voltage on the other bit line.

2. A memory cell as in claim 1 further characterized by said pair of current source transistors comprising PNP transistors.

3. A memory cell as in claim 1 further characterized by said pair of switching transistors comprising NPN transistors.

4. A semiconductor memory cell structure comprising:

a. a semiconductor substrate of a first conductivity type;
 b. a buried layer formed in said substrate from semiconductor material of a second conductivity type to form a word line of said semiconductor memory cell;
 c. an epitaxial layer formed over said buried layer from a semiconductor material of said first conductivity type, said epitaxial layer being partitioned into two halves by an isolation barrier;
 d. each half of said epitaxial layer comprising:
  i. a first region of semiconductor material of said second conductivity type,
  ii. a second region of semiconductor material of said first conductivity type,
  iii. a third region of semiconductor material of said second conductivity type, and
  iv. a fourth region of semiconductor material of said first conductivity type;
 e. first electrical conducting means forming a first bit line and coupled to said second region in a first half of said epitaxial layer;
 f. second electrical conducting means forming a second bit line and coupled to said second region and the second half of said epitaxial layer;
 g. third electrical conducting means coupling said third region in the first half of said epitaxial layer with said fourth region in the second half of said epitaxial layer; and
 h. fourth electrical conducting means coupling said fourth region in the first half of said epitaxial layer with said third region in the second half of said epitaxial layer.

5. A structure as in claim 4 further characterized by said isolation barrier comprising insulation material.

6. A structure as in claim 5 further characterized by said insulating material comprising silicon dioxide.

7. A structure as in claim 4 further characterized by said isolation barrier comprising a PN isolation junction.

8. A structure as in claim 4 further characterized by said first conductivity type comprising p-type semiconductor material.

9. A structure as in claim 4 further characterized by said second conductivity type comprising n-type semiconductor material.

10. A structure as in claim 4 further characterized by said first region comprising heavily-doped n-type semiconductor material.

11. A structure as in claim 4 further characterized by said buried layer comprising heavily-doped n-type semiconductor material.

12. A structure as in claim 4 further characterized by said fourth region comprising heavily-doped p-type semiconductor material.

13. A semiconductor memory array comprising N×M memory cell structures as defined in claim 4, wherein N is a positive integer representing the number of cells in a row of said array, and M is a positive integer representing the number of cells in a column of said array.

14. A semiconductor memory array as in claim 13, further characterized by each of said memory cells in said array being isolated from each adjacent cell by means of an isolation barrier.

15. A semiconductor memory array as in claim 14 further characterized by said isolation barrier comprising insulating material.

16. A semiconductor memory array as in claim 15 further characterized by said insulating material comprising silicon dioxide.

17. A semiconductor memory array as in claim 14 further characterized by said isolation barrier comprising a PN isolation junction.

18. A semiconductor memory array as in claim 14 further characterized by said isolation barrier between each cell in each row comprising a PN isolation junction, and between each cell in each column comprising insulating material.

* * * * *